(12) United States Patent
De Jager et al.

(10) Patent No.: US 7,609,362 B2
(45) Date of Patent: Oct. 27, 2009

(54) SCANNING LITHOGRAPHIC APPARATUS AND DEVICE MANUFACTURING METHOD

(75) Inventors: Pieter Willem Herman De Jager, Rotterdam (NL); Cheng-Qun Gui, Best (NL); Jacob Fredrik Friso Klinkhamer, Delft (NL); Eduard Hoeberichts, Mol (NL)

(73) Assignee: ASML Netherlands B.V., Veldhoven (NL)

( * ) Notice: Subject to any disclaimer, the term of this patent is extended or adjusted under 35 U.S.C. 154(b) by 686 days.

(21) Appl. No.: 10/983,336

(22) Filed: Nov. 8, 2004

(65) Prior Publication Data

US 2006/0098175 A1 May 11, 2006

(51) Int. Cl.
*G03B 27/54* (2006.01)
*G03B 27/72* (2006.01)

(52) U.S. Cl. .............................. 355/67; 355/71; 359/290
(58) Field of Classification Search .................... 355/55, 355/53, 67, 71; 359/290, 291, 618, 621, 359/622
See application file for complete search history.

(56) References Cited

U.S. PATENT DOCUMENTS

| 5,229,872 | A |   | 7/1993 | Mumola | 430/106 |
| 5,258,856 | A | * | 11/1993 | Shinada | 358/474 |
| 5,296,891 | A |   | 3/1994 | Vogt et al. | 355/67 |
| 5,500,736 | A |   | 3/1996 | Koitabashi et al. | 356/375 |

(Continued)

FOREIGN PATENT DOCUMENTS

CN 1166987 A 12/1997

(Continued)

OTHER PUBLICATIONS

English Translation of JP 2003-195512 (dated Jul. 9, 2003).*

(Continued)

*Primary Examiner*—Alan A Mathews
(74) *Attorney, Agent, or Firm*—Sterne, Kessler, Goldstein & Fox P.L.L.C.

(57) ABSTRACT

A lithographic apparatus and method for exposing a substrate. An illumination system supplies a series of beams of radiation that are patterned by an array of individually controllable elements. The patterned beams are projected through arrays of lenses onto target portions of a substrate. Each lens in the arrays directs a respective part of the patterned beam towards the substrate. A displacement system causes relative displacement between the substrate and the beam, such that the beams are scanned across the substrate in a predetermined scanning direction. The projection systems are positioned so that each beam is scanned along a respective one of a series of tracks on the substrate. The tracks overlap so that each track comprises a first portion that is scanned by one beam and at least one second portion that overlaps an adjacent track, and is scanned by two beams. A maximum intensity of a first part of each beam directed towards a first portion of the track can be greater than a maximum intensity of a second part of that beam directed towards a second portion of the track, such that the first and second portions of the track are exposed to radiation of substantially the same maximum intensity. Such overlapping of adjacent beams and modulation of the intensity of the beams can allow the optical footprints of different optical columns to be seamed together to enable exposure of large area substrates in a single scan.

21 Claims, 9 Drawing Sheets

U.S. PATENT DOCUMENTS

| | | | | |
|---|---|---|---|---|
| 5,523,193 | A | * | 6/1996 | Nelson ................. 430/311 |
| 5,530,482 | A | | 6/1996 | Gove et al. ............ 348/441 |
| 5,579,147 | A | | 11/1996 | Mori et al. ............ 359/204 |
| 5,677,703 | A | | 10/1997 | Bhuva et al. ........... 345/84 |
| 5,808,797 | A | | 9/1998 | Bloom et al. ........... 359/572 |
| 5,982,553 | A | | 11/1999 | Bloom et al. ........... 359/627 |
| 6,133,986 | A | * | 10/2000 | Johnson ................. 355/67 |
| 6,177,980 | B1 | | 1/2001 | Johnson ................. 355/67 |
| 6,285,488 | B1 | * | 9/2001 | Sandstrom ............... 359/290 |
| 6,538,723 | B2 | | 3/2003 | Hagiwara et al. |
| 6,687,041 | B1 | | 2/2004 | Sandstrom ............... 359/291 |
| 6,747,783 | B1 | | 6/2004 | Sandstrom ............... 359/290 |
| 6,795,169 | B2 | | 9/2004 | Tanaka et al. ........... 355/55 |
| 6,806,897 | B2 | | 10/2004 | Kataoka et al. .......... 347/256 |
| 6,811,953 | B2 | | 11/2004 | Hatada et al. ........... 430/311 |
| 7,068,414 | B2 | * | 6/2006 | Sunagawa et al. ......... 359/290 |
| 2003/0116529 | A1 | * | 6/2003 | Kumakhov ................ 216/11 |
| 2004/0027681 | A1 | | 2/2004 | Sunagawa et al. |
| 2004/0041104 | A1 | | 3/2004 | Liebregts et al. ....... 250/492.22 |
| 2004/0075882 | A1 | * | 4/2004 | Meisburger .............. 359/290 |
| 2004/0130561 | A1 | | 7/2004 | Jain .................... 345/694 |
| 2005/0007572 | A1 | | 1/2005 | George et al. ........... 355/55 |

FOREIGN PATENT DOCUMENTS

| | | |
|---|---|---|
| EP | 1 251 402 A1 | 10/2002 |
| EP | 1 602 974 A1 | 12/2005 |
| JP | 63-185027 A | 7/1988 |
| JP | 4-240718 A | 8/1992 |
| JP | 11-251219 A | 9/1999 |
| JP | 2001-297975 A | 10/2001 |
| JP | 2003-195512 A | 7/2003 |
| JP | 2004-009595 A | 1/2004 |
| JP | 2004-062156 A | 2/2004 |
| KR | 2002-0077263 A | 10/2002 |
| TW | 487964 | 5/2002 |
| TW | 1262361 | 9/2006 |
| WO | WO 97-34171 A2 | 9/1997 |
| WO | WO 98/33096 | 7/1998 |
| WO | WO 98/38597 | 9/1998 |
| WO | WO 99-45436 A1 | 9/1999 |
| WO | WO 99/45441 A1 | 9/1999 |

OTHER PUBLICATIONS

English Translation of JP 2004-009595 (dated Jan. 15, 2003).*
English Translation of JP 11—251219 (dated Sep. 17, 1999).*
English Translation of JP 2001-297975 (dated Oct. 26, 2001).*
Translation of Office Action and Search Report of the ROC (Taiwan) Patent Application No. 094137533, completion of search Feb. 11, 2007, 7 pgs.
Translation of Office Action for Korean Application No. 10-2007-0063533, mailed on Sep. 19, 2007, 3 pgs.
English Abstract of Japanese Patent Pub. 2003-195512 published Jul. 9, 2003, 1 pg.
English Abstract of Japanese Patent Pub. 2004-009595 published Jan. 15, 2004, 1 pg.
English Abstract of Japanese Patent Pub. 2004-062156 published Feb. 26, 2004, 1 pg.
Translation of First Office Action for Chinese Application No. 200510120144.1 issued Sep. 18, 2008, 8 pgs.
Notification of Reasons for Refusal copy and translation for Japanese Patent Application No. 2005-321654 mailed Sep. 16, 2008, 6 pgs.
English Abstract for Japanese publication No. JP2001500628T published Jan. 16, 2001, 1 pg.
English Abstract for Japanese publication No. JP20025506231T published Feb. 26, 2002, 1 pg.

* cited by examiner

SCANNING LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

Some lithography systems include scanners having one or more optical columns (e.g., light paths). Conventional scanners cannot expose a large area substrate in a single scan. One reason for this is that it is difficult to produce a single optical column capable of exposing a large target portion. For example, it would be desirable to be able to manufacture flat panel displays (FPD's) on panels with dimensions of the order of 2 meters along each panel edge, but it would be very difficult to produce a single optical column capable of exposing a target portion extending across substantially the whole width of such a pattern.

One way to address this problem has been to expose a full width of a panel using a series of separate optical columns arranged such that each optical column scans a respective track on the substrate. In this case, adjacent tracks abut, so as to expose the full width of the panel. Unfortunately, it is difficult to maintain separate optical columns in appropriate positions relative to each other to avoid a small gap arising between adjacent tracks or to avoid a small overlap between adjacent tracks. Such misalignments could affect the functionality of the device being manufactured, and in the case of FPD's, could result in the appearance of a highly visible line on the display.

Therefore, what is needed is a lithography system and method of using same that can be used to scan a large area substrate in a single scan.

SUMMARY OF THE INVENTION

According to an embodiment of the invention, there is provided a lithographic apparatus comprising an illumination system, patterning systems, projection systems, and a displacement system. The illumination system supplies beams of radiation. The patterning systems pattern the beams. The projection systems project the patterned beams onto target portions of a substrate. The displacement system causes relative displacement between the substrate and the projection systems, such that the beams are scanned across the substrate in a predetermined scanning direction. Each projection system comprises an array of lenses arranged, such that each lens in the array directs a respective part of the respective beam towards the substrate. Each patterning system comprises an array of individually controllable elements controlled to impart a desired pattern to the respective beam. The projection systems are positioned so that each beam is scanned along a respective one of a series of tracks on the substrate. The tracks overlap so that each track comprises a first portion that is scanned by only one beam and at least one second portion that overlaps an adjacent track and is scanned by two beams. A maximum intensity of a first part of each beam directed towards a first portion of a track is greater than a maximum intensity of a second part of that beam directed towards a second portion of the track, such that the first and second portions of the track are exposed to radiation of substantially the same maximum intensity.

By providing for overlap between adjacent scanned tracks and adjusting the intensity of radiation projected onto the overlapping region as compared with non-overlapping regions, large step-changes in the exposure intensity in the region of the edges of individual tracks can be avoided. Thus, tracks scanned by different optical engines can be seamed together in a manner that minimizes the adverse effects of misalignment between the relative positions of adjacent tracks.

According to another embodiment of the invention, there is provided a device manufacturing method comprising the following steps. Patterning beams of radiation. Projecting the patterned beams onto target portions of a substrate supported on a substrate table. Causing relative displacement between the substrate and the beam, such that the beams are scanned across the substrate in a predetermined scanning direction. Each beam is directed towards the substrate through an array of lenses. Each lens in the array directs a respective part of the beam, such that patterns are imparted to the beams by an array of individually controllable elements. Each beam is scanned along a respective one of a series of tracks on the substrate. The tracks overlap, such that each track comprises a first portion that is scanned by only one beam and at least one second portion that overlaps an adjacent track and is scanned by two beams. A maximum intensity of a first part of each beam directed towards a first portion of a track is greater than a maximum intensity of a second part of that beam directed towards a second portion of the track, such that the first and second portions of the track are exposed to radiation of substantially the same maximum intensity.

In one example, each beam can be generated by a respective optical column in an array of optical columns distributed across the substrate table in a direction perpendicular to the scanning direction. Adjacent optical columns can be offset in the scanning direction. Alternatively, at least two overlapping beams can be directed towards the substrate through adjacent columns of lenses in a common lens array. The adjacent columns extend in a direction inclined to the scanning direction, and are spaced apart in a direction perpendicular to the scanning direction. The beams are patterned using an array of individually controllable elements. In one example, the pattern imparted to the beams can be continuously updated during continuous scanning of a substrate.

The maximum intensity of different portions of an individual beam can be determined by providing an attenuating device, through which the beam is transmitted. For example, an absorbing device that absorbs a proportion of the beam. In this example, at least one peripheral portion of the absorbing device can absorb a proportion of the beam and be positioned such that radiation transmitted through that peripheral portion is projected towards a second portion of the respective track. In various examples, the absorbing device could be positioned between the illumination system and the patterning system or between the patterning system and the substrate.

In one example, each beam is patterned by an array of individually controllable elements capable of delivering either a minimum, a maximum, or at least one intermediate intensity component of a beam. In one example, a control device is used to control the elements to reduce the intensity of components of the beam directed towards a second portion of the track.

In one example, each beam is delivered to the substrate through an array of lenses arranged such that each lens of the array directs a respective part of the respective beam towards a respective area of the substrate. Lenses of the array that direct parts of the beam towards a second portion of the track are arranged to absorb or otherwise attenuate, e.g., by partial reflection, more of the beam than lenses of the array that direct parts of the beam towards a first portion of the track.

In one example, the intensity of a second part of a beam can be reduced progressively from an edge of the second portion of the track that is adjacent to the first portion of that track to the other edge of the second portion of the track. Thus, the delivered intensity of one beam is tapered downwards towards the edge of the area scanned by that beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 5:
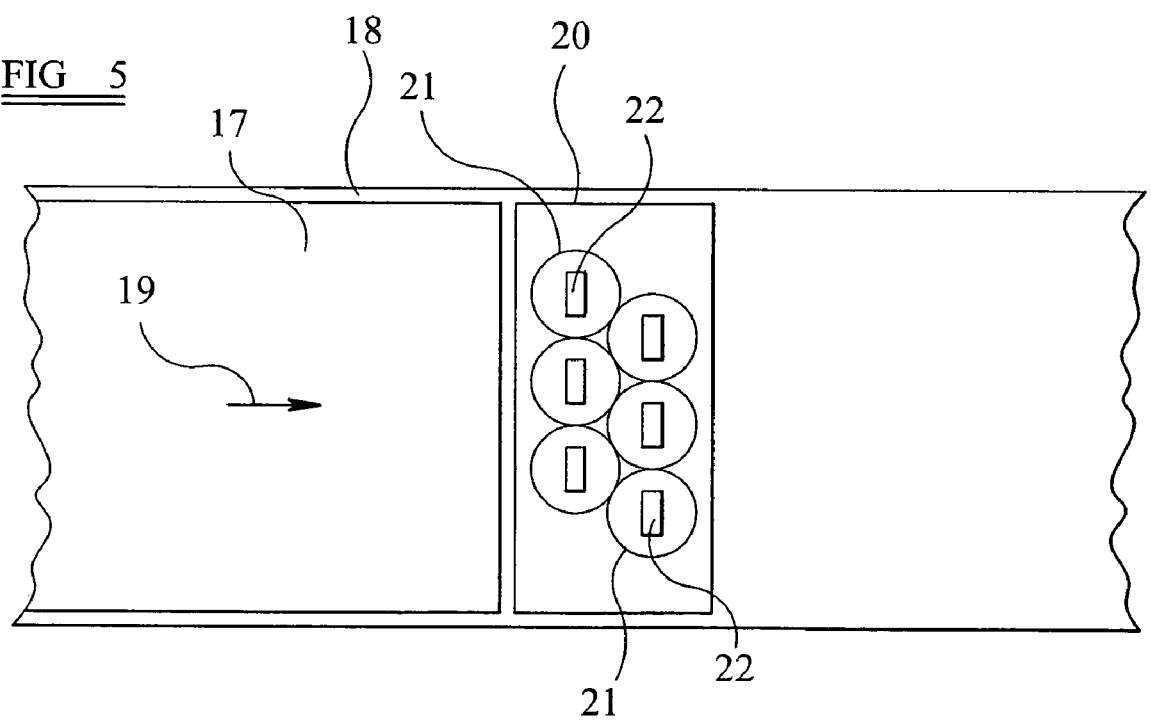
FIG. 5 is a schematic representation of an arrangement of an array of optical columns, according to one embodiment of the present invention.
Figure 6:
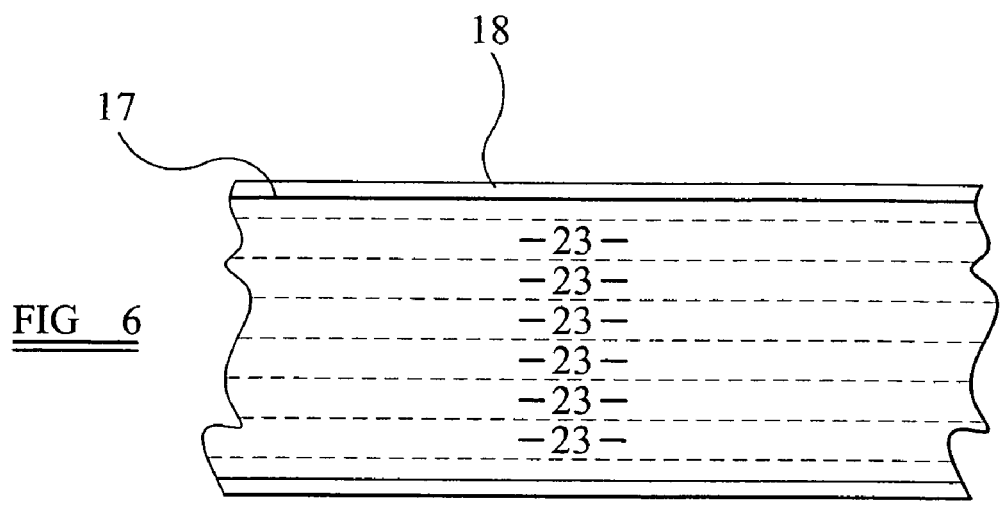

FIG. 6 schematically represents a position relative to a substrate of tracks scanned by optical columns of FIG. 5, according to one embodiment of the present invention.

Figure 7:
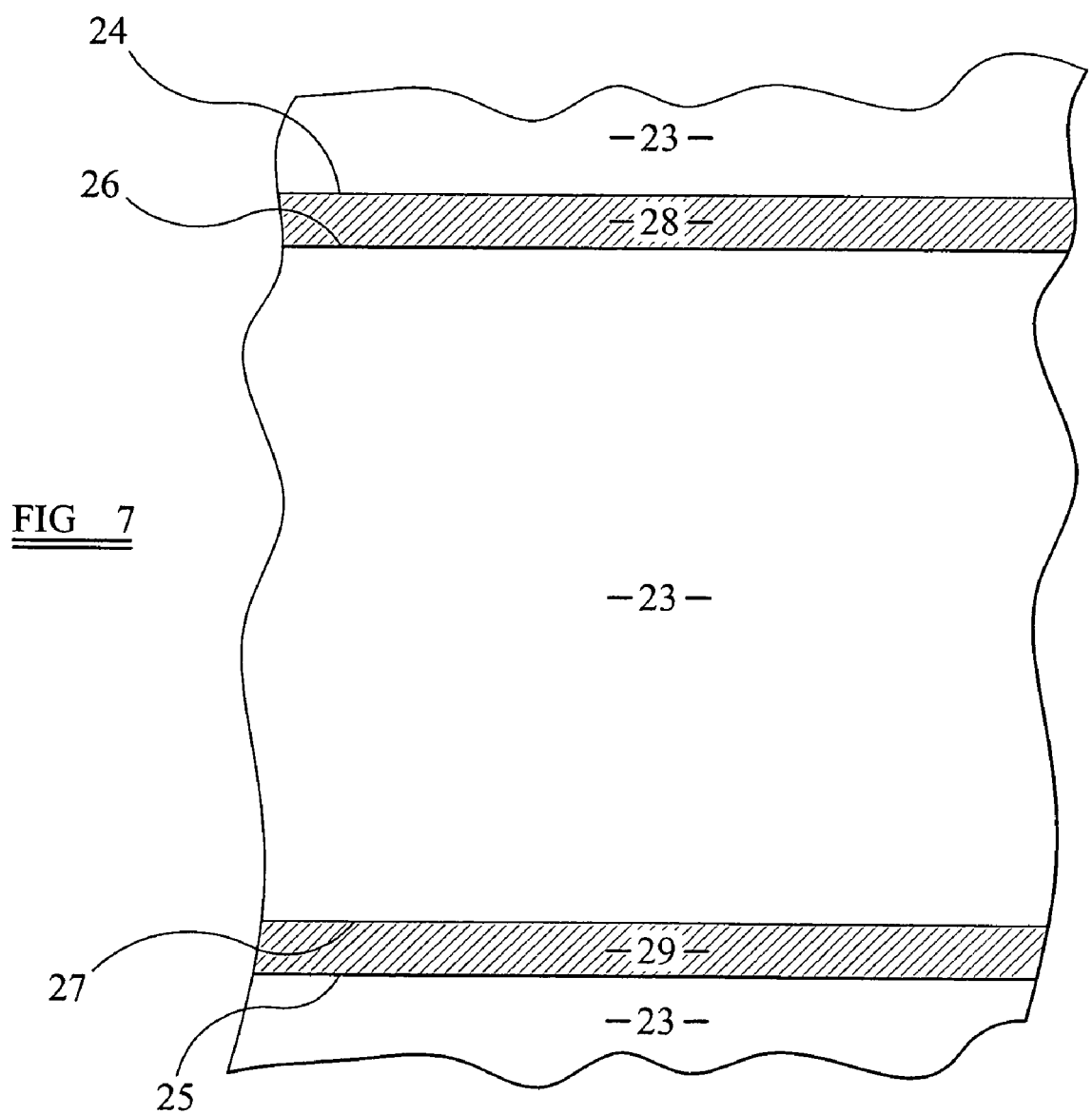

FIG. 7 schematically represents the overlap between one of the tracks shown in FIG. 6 and two adjacent tracks, according to one embodiment of the present invention.

Figure 8A:
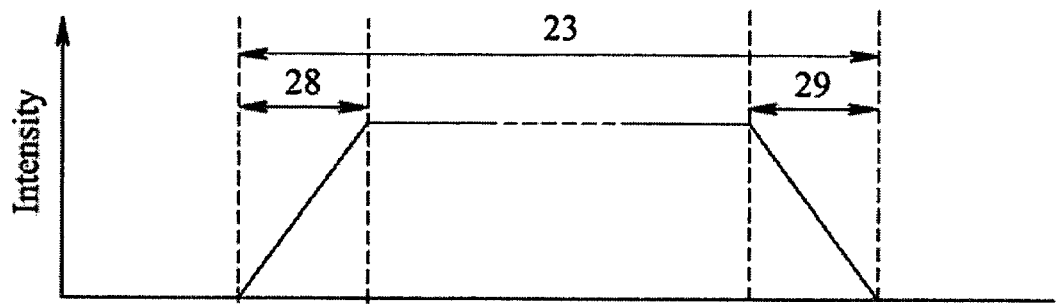
Figure 8B:
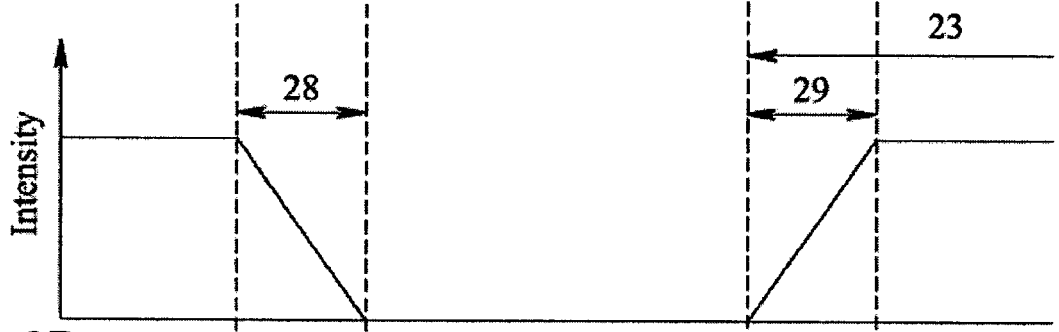
Figure 8C:
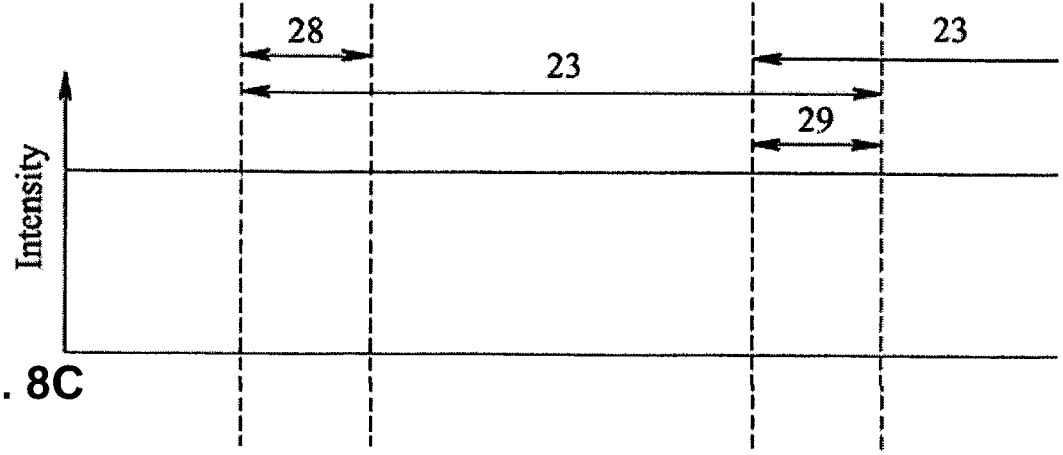

FIGS. 8A, 8B, and 8C schematically represent intensity of beams in overlapping regions of adjacent tracks when a continuous variation in intensity exists across a width of an overlapping region between two tracks, according to various embodiments of the present invention.

Figure 9:
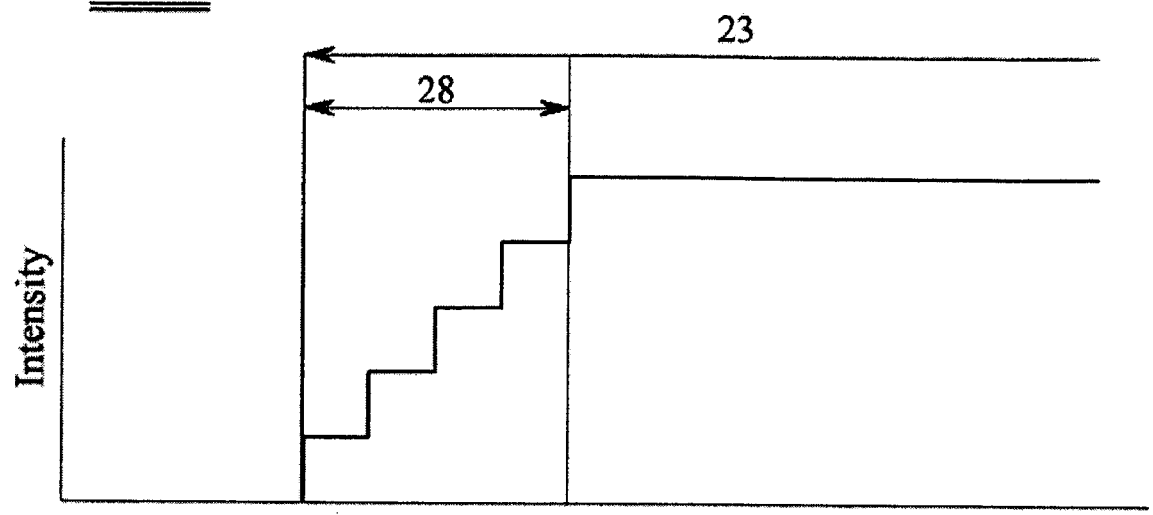

FIG. 9 represents an alternative step-wise variation in intensity across an overlapping region between two tracks, according to one embodiment of the present invention.

Figure 10:
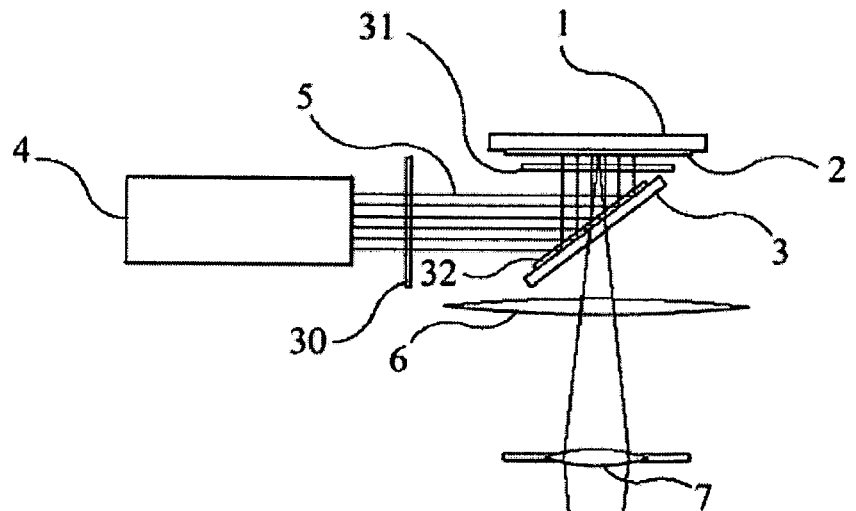

FIG. 10 schematically represents four alternative positions for an absorbing device capable of producing a variation in intensity represented in FIG. 8 or FIG. 9, according to one embodiment of the present invention.

Figure 11:
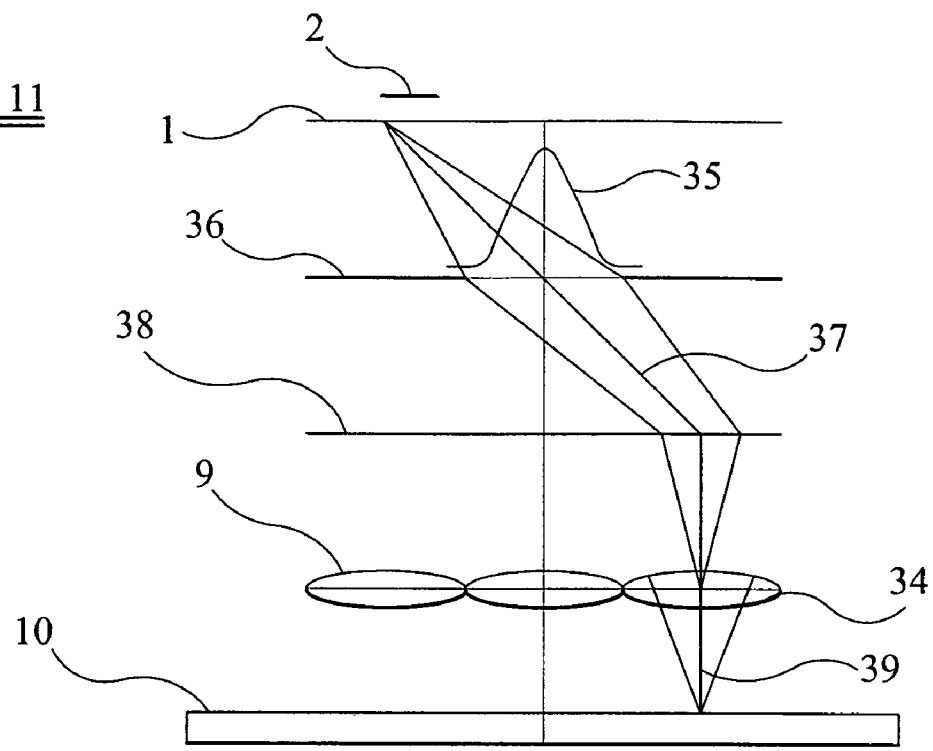
Figure 12:
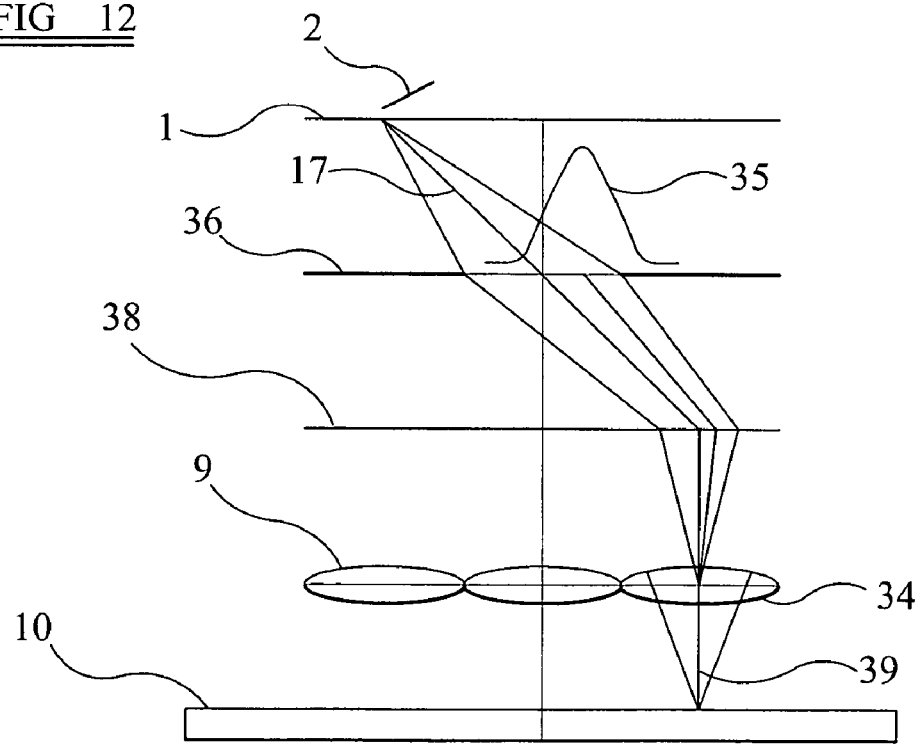

FIGS. 11 and 12 schematically represent the manner in which a reflective controllable element is used to adjust the intensity of one part of a beam, according to embodiments of the present invention.

Figure 13:
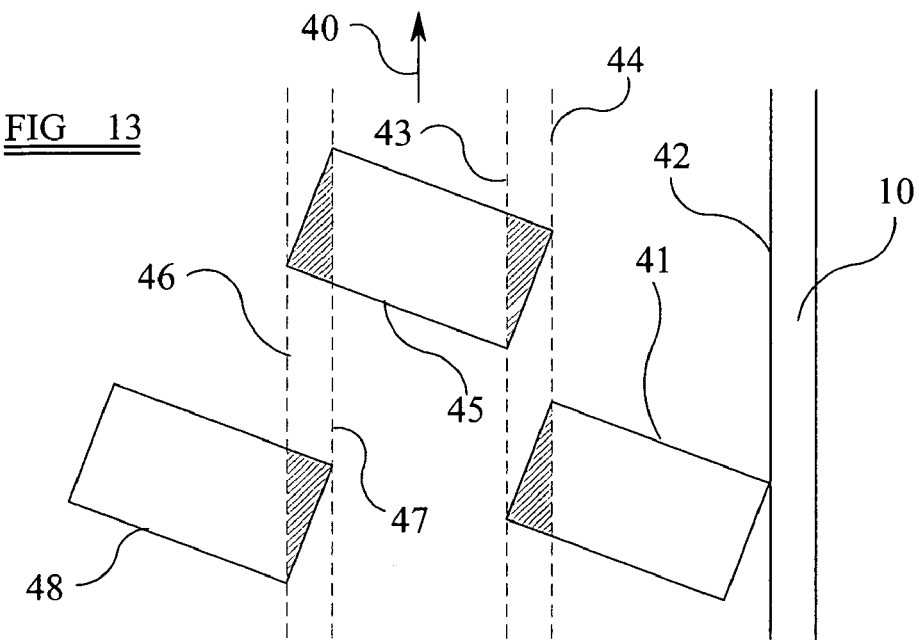

FIG. 13 schematically represents the arrangement of three optical columns each incorporating a microlens array positioned to expose overlapping tracks on a substrate, according to one embodiment of the present invention.

Figure 14:
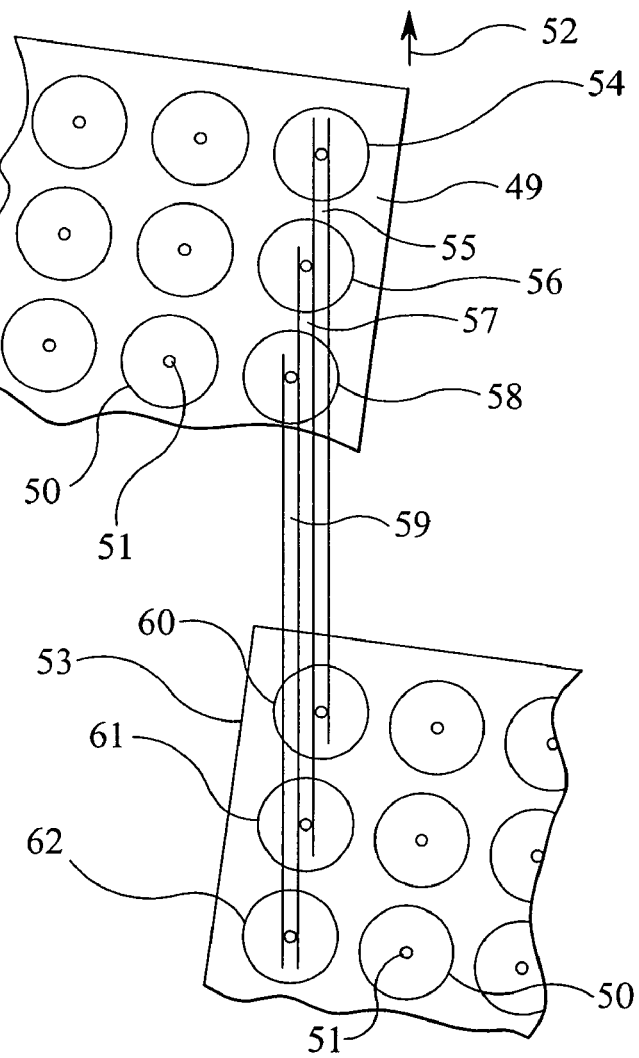

FIG. 14 schematically represents the disposition of individual lenses in two microlens arrays arranged to expose overlapping tracks on a substrate, according to one embodiment of the present invention.

Figure 15:
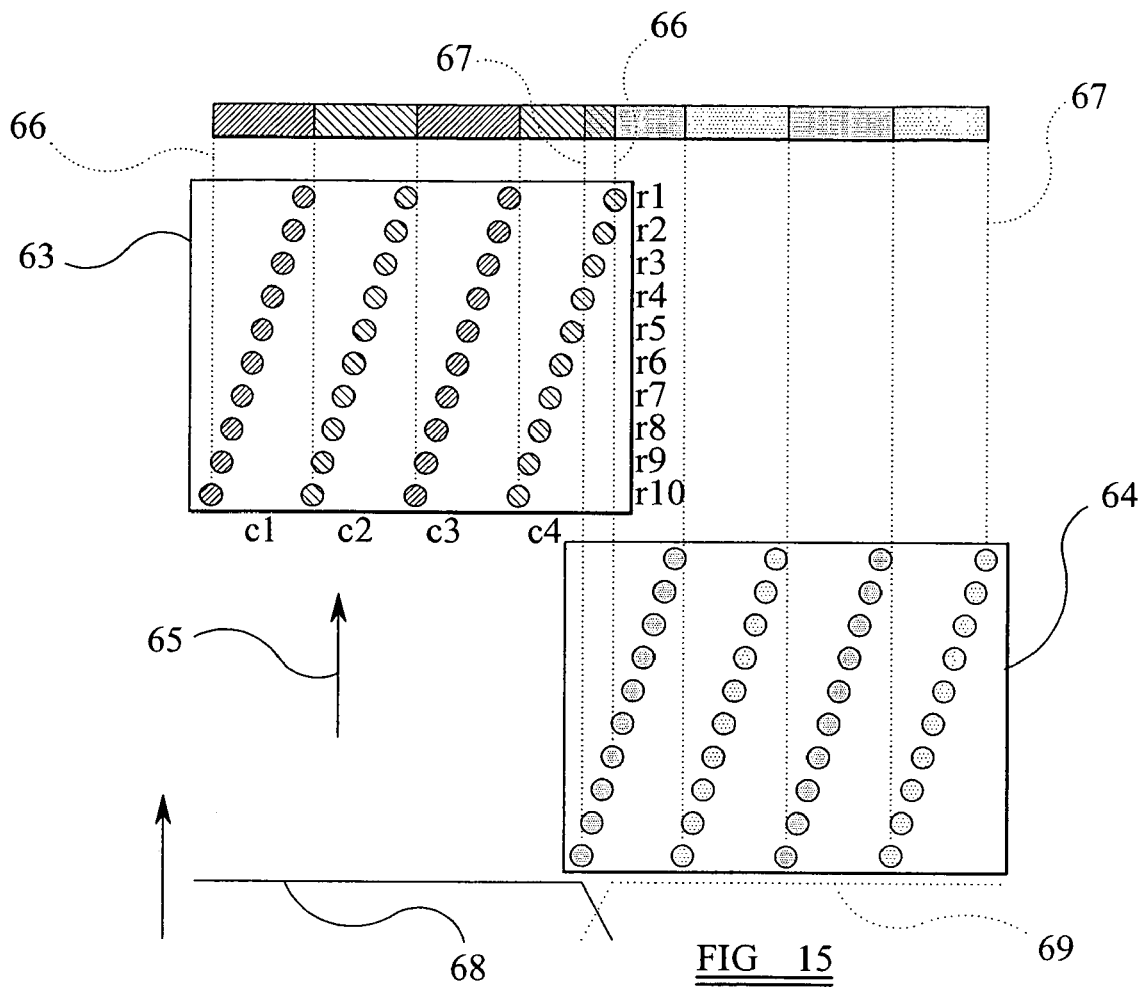

FIG. 15 is an illustration of overlapping tracks produced by different optical columns, according to one embodiment of the present invention.

Figure 16:
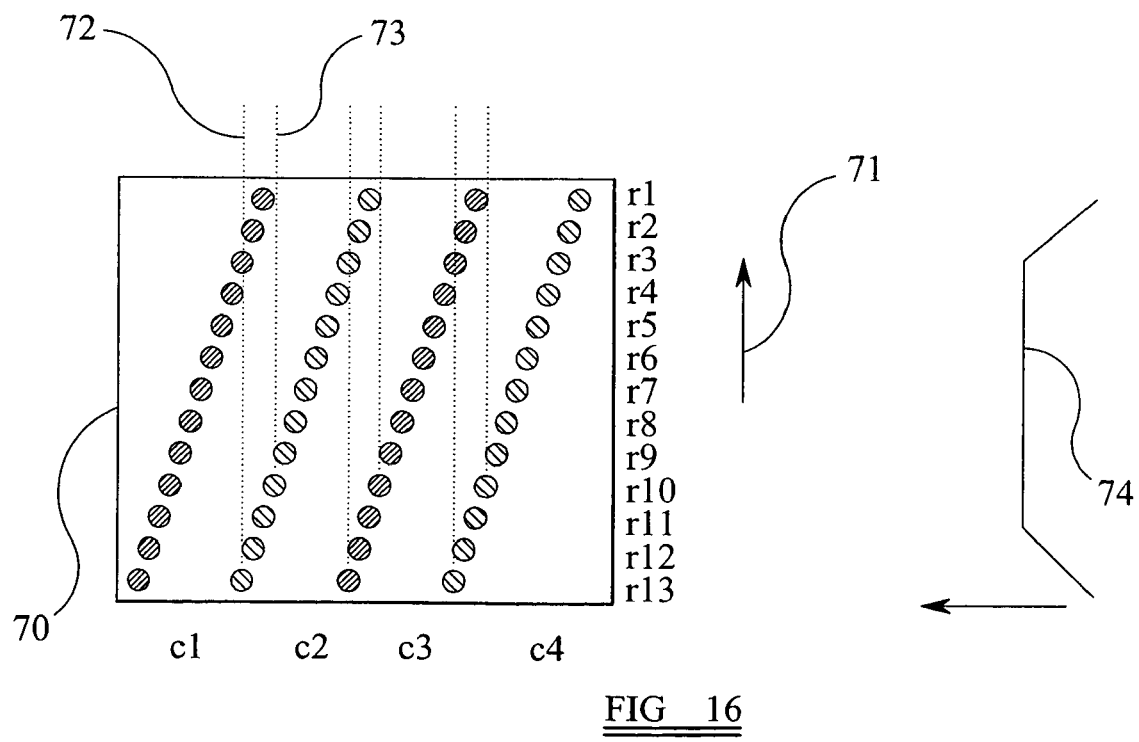

FIG. 16 is a representation of overlapping tracks produced by adjacent columns of lenses in an array of lenses, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool.

Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the mask and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
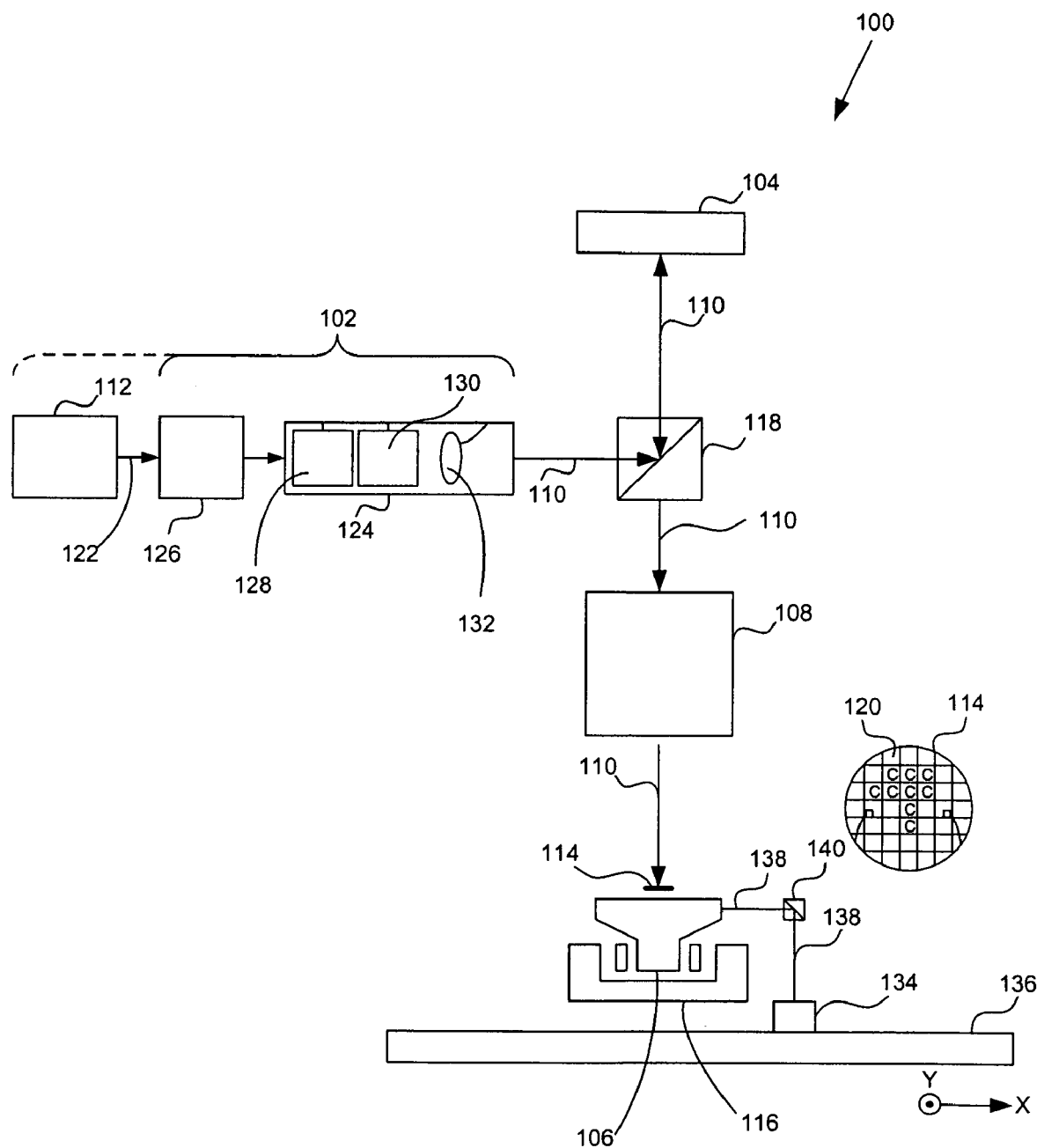
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplary Projection Systems

Figure 2:
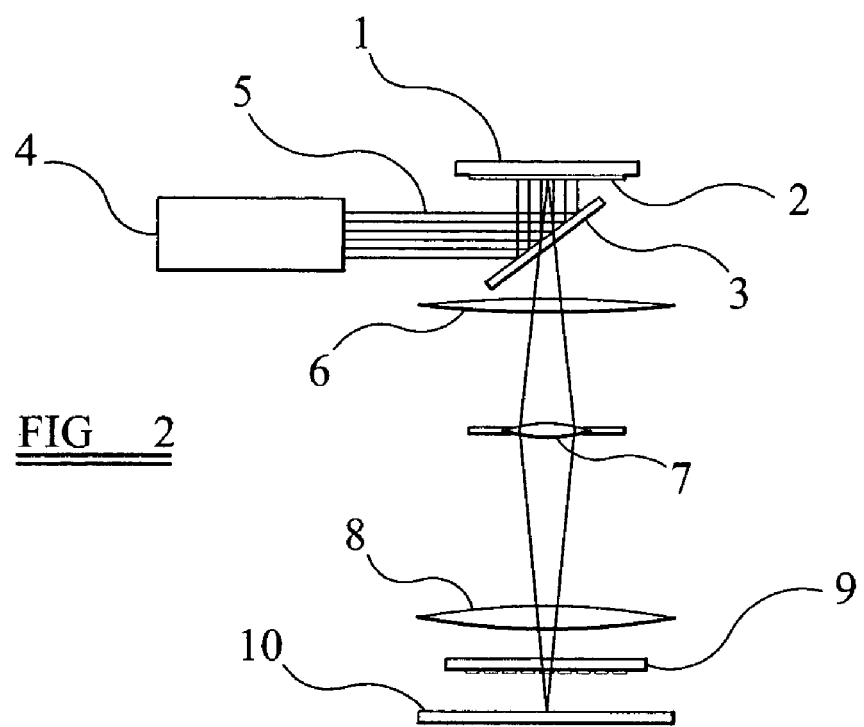
FIG. 2 shows an optical projection system including a microlens array, according to one embodiment of the present invention.

FIG. 2 shows an optical projection system including a microlens array, according to one embodiment of the present invention. The apparatus shown in FIG. 2 comprises a contrast device 1 having an underside surface that supports a two dimensional array of elements 2. An angular position of each element in array of elements 2 can be selectively controlled. A beam splitter 3 is positioned beneath contrast device 1. An illumination source 4 directs a beam of radiation 5 towards beam splitter 3. Beam of radiation 5 is reflected onto a lower surface of contrast device 1. One of the elements of contrast device 1 is shown as reflecting a component part of beam 5 back through beam splitter 3 and projection optics defined by lenses 6, 7, and 8. In this example, a lowermost lens 8 is a field lens, which produces a substantially telecentric beam that is directed towards a microlens array 9. In one example, microlens array 9 comprises a two dimensional array of small lenses. Each lens is arranged to focus light incident upon it onto an upper surface of a substrate 10.

In this example, for each of the elements 2 in contrast device 1 that acts as a mirror reflecting light to microlens array 9, a respective one of the lenses in microlens array 9 is illuminated. A respective spot of light is projected by the illuminated lens in microlens array 9 onto the upper surface of substrate 10. It is to be appreciated that, although in this arrangement, contrast device 1 is imaged on substrate 10, but other arrangements are possible. For example, a pupil of projection system 6, 7, 8 could be imaged on substrate 10.

Figure 3:
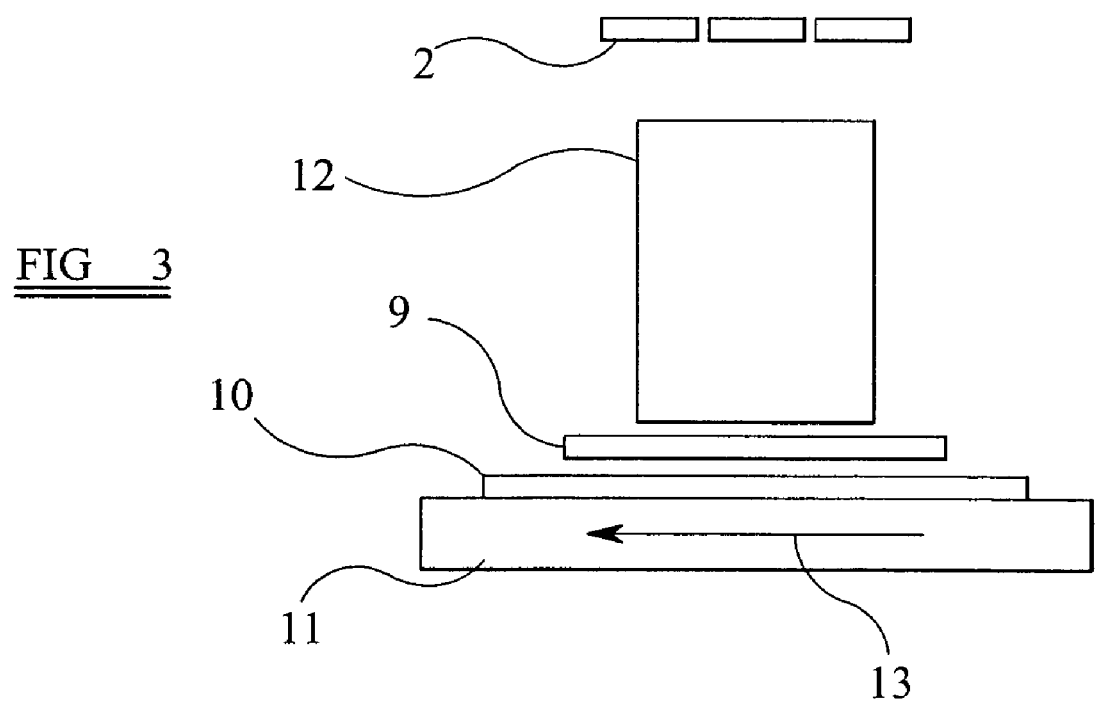
FIG. 3 shows the optical projection system of claim 2 including a displaceable substrate table, according to one embodiment of the present invention.

FIG. 3 shows the optical projection system of claim 2 including a displaceable substrate table, according to one embodiment of the present invention. In FIG. 3, substrate 10 is shown supported on a substrate table 111 beneath microlens array 9. The projection optics are represented by a rectangle 12. Three contrast elements 2 of contrast device 1 of FIG. 2 are shown above projection optics 12. In the illustrated arrangement, substrate table 11 is moved in a linear manner in the direction of arrow 13 beneath microlens array 9.

Figure 4:
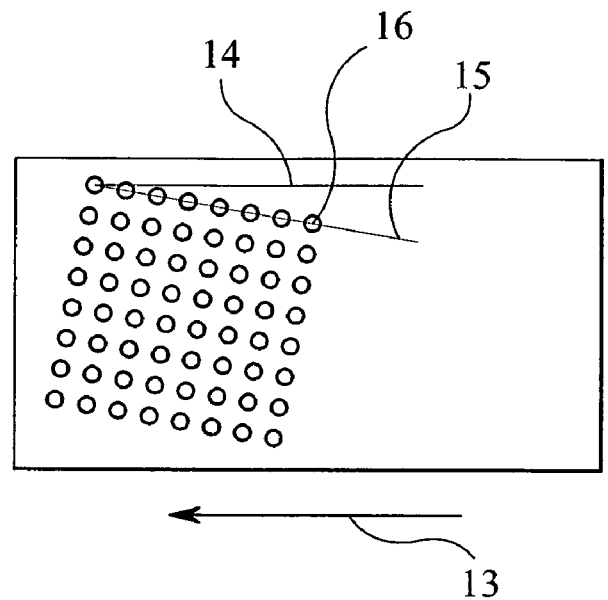
FIG. 4 is a schematic representation of an orientation of the spots of light projected onto a substrate in the system illustrated in FIG. 3, according to one embodiment of the present invention.

FIG. 4 is a schematic representation of an orientation of the spots of light projected onto a substrate in the system illustrated in FIG. 3, according to one embodiment of the present invention. FIG. 4 shows a relationship between a disposition of the individual lenses in microlens array 9 of FIGS. 2 and 3 and a direction of displacement of substrate table 11 of FIG. 3. The direction of displacement is represented in FIG. 4 by arrow 13. That direction is parallel to a line 14 that is inclined to a further line 15, which extends parallel to a column of the lenses in microlens array 9. Lenses in adjacent columns are aligned to define rows extending perpendicular to lens 15. Each lens projects light onto a different one of a rectangular array of spots, one of which is identified by numeral 16. The lenses are arranged in a regular two dimensional array, which is slightly inclined to the direction 13 of substrate table movement, such that the entire surface of substrate 10 can be exposed by appropriate control of illumination beams 5 delivered to the respective lenses by the respective elements of contrast device 1.

In one example, each lens can in effect "write" a continuous line on the surface of substrate 10. Those lines are sufficiently close together to overlap.

In one example, to expose a selected two dimensional area of substrate 10, substrate 10 is advanced beneath microlens array 9 and the individual lenses beneath which the area to be exposed is positioned at any one time are illuminated by appropriate control of the associated elements of contrast device 1.

Exemplary Projection System Including Optical Columns

FIG. 5 is a schematic representation of an arrangement of an array of optical columns, according to one embodiment of the present invention. In this example, an apparatus operates in continuous scan mode. A substrate 17 is positioned on a substrate table 18 and is displaceable across substrate table 18 in the direction of arrow 19. Positioned above substrate table 18 is a bridge 20 supporting, for example, six optical columns 21, each of which incorporates components occupying a space indicated by a circle and delivering a beam with a footprint represented by rectangle 22.

In this example, as substrate 17 is advanced across substrate table 18 in the direction of arrow 19 each of optical footprints 22 is scanned across substrate 17. Each optical column 21 can be used to expose a respective track on the surface of substrate 17. The track extends parallel to the direction indicted by arrow 19, and has a width corresponding to the dimension of optical footprint 22 in the direction perpendicular to the arrow 19.

In this example, the six optical columns 21 shown in FIG. 5 are arranged in two rows perpendicular to the direction indicated by arrow 19. The six optical columns 21 are distributed in a direction perpendicular to the direction indicated by arrow 19, but optical columns that are adjacent in the direction perpendicular to the arrow 19 are also offset in the direction of arrow 19. In this example, this is generally necessary as the equipment making up each optical column 21 has to occupy a footprint greater than an area of optical footprint, for example represented by rectangle 22. Thus, if the six optical columns 21 shown in FIG. 5 were to expose a line on substrate 17 extending perpendicular to arrow 19, three first sections of that line would be exposed by the left most row of three optical columns 21 when substrate 17 is in a first position relative to bridge 20 and the other three portions of that line would be exposed by the right most row of optical columns 21 after further displacement of substrate 17.

FIG. 6 schematically represents a position relative to a substrate of tracks 23 scanned by optical columns of FIG. 5, according to one embodiment of the present invention. FIG. 6 represents tracks 23 that can be exposed by optical columns 21 of FIG. 5 on substrate 17 that is placed on substrate table 18. Each track 23 has boundaries of represented by broken lines.

FIG. 7 schematically represents the overlap between one of tracks 23 shown in FIG. 6 and two adjacent tracks 23, according to one embodiment of the present invention. A central track 23 extends between edges indicated by lines 24 and 25. Adjacent tracks 23 extend on one side to a position indicated by line 26 and on the other side to a position indicated by line 27. There is a region of overlap between adjacent tracks 23 indicated by shaded area 28 on one side and shaded area 29 on the other side.

In one example, the intensity of a beam responsible for exposing the area between lines 24 and 25 is uniform, except in the overlap areas 28 and 29. Similarly the adjacent tracks 23 are of uniform intensity, except in the areas 28 and 29.

In one example, an intensity of two beams that contribute to the exposure of area 28 is modulated, such that the overall intensity of the radiation reaching the area 28 is substantially the same as the intensity of the radiation reaching the area between the overlap areas 28 and 29. For example, if all three tracks 23 represented are at any particular instant intended to receive exactly the same intensity of illumination, all of the areas, including the overlap areas 28 and 29, will receive substantially the same radiation intensity.

In this embodiment, given the offset of the optical columns 21 shown in FIG. 5 in the direction of arrow 19, whereas the central section of each track 23 will be exposed by a single optical column 21 as substrate 17 is scanned beneath that optical column 21, areas 28 and 29 will be exposed in two successive stages. The first exposure step occurring as the relevant part of substrate 17 passes beneath one of the left hand row of optical columns 21, as shown in FIG. 5. The second step occurring as that same section of substrate 17 passes beneath the right hand row of optical columns 21, as shown in FIG. 5.

Exemplary Intensity Characteristics and Systems for Producing Same

FIGS. 8A, 8B, and 8C schematically represent intensity of beams in overlapping regions of adjacent tracks 23 when a continuous variation in intensity exists across a width of an overlapping region between two tracks 23, according to various embodiments of the present invention. For example, these graphs represent the intensity of beams delivered to the three tracks 23 represented in FIG. 7 including the areas of overlap 28 and 29.

A graph in FIG. 8A shows the intensity of a single beam delivered to track 23 that is shown centrally in FIG. 7, assuming that the required pattern delivered by that beam is a uniform 100% intensity. It will be noted that the intensity tapers down from 100% to zero across each region 28 and 29. Of course, if the beam is patterned so as to include pattern areas of zero intensity and pattern areas of 100% intensity, the overall pattern represented in the graph of FIG. 8A would not be uniform as illustrated, but for the purposes of explaining the invention uniformity in the required exposure of the underlying substrate is assumed.

A graph in FIG. 8B represents the intensity of beams delivered by the two beams that expose the two overlap areas 28 and 29 represented in FIG. 7. Each of these beams also has a tapering intensity extending from 100% at one extreme of the regions 28, 29 to zero intensity at the other extreme.

A graph in FIG. 8C represents the sum of the intensities delivered by the three beams that contribute to the three tracks 23 represented in FIG. 7. The intensity is constant across regions 28 and 29. It will be appreciated that if there was some misalignment between the three beams contributing to the exposure of central track 23 in FIG. 7, for example a misalignment of 10%, the overall intensity distribution would vary somewhat but by at most + and −10% of the nominal 100% intensity value. Thus, the significance of misalignment between exposure tracks 23 is substantially reduced.

FIG. 9 represents an alternative step-wise variation in intensity across an overlapping region between two tracks 23, according to one embodiment of the present invention. Thus, FIG. 9 represents an alternative intensity distribution to that represented in FIG. 8. Rather that relying upon a continuous tapering downwards of the delivered intensity towards the edge of any particular track 23, as shown in FIG. 9, the intensity can be reduced in a step-wise manner. In the case illustrated in FIG. 9, each of the individual steps represents 20% of the overall nominal 100% intensity. Assuming that a misalignment was not more than the width of one of these five steps, the overall intensity dosage would not diverge from the nominal value by more than + or −20%.

FIG. 10 schematically represents four alternative positions for an absorbing device 30, 31, 32 or 33 capable of producing a variation in intensity represented in FIG. 8 or FIG. 9, according to one embodiment of the present invention. In one example, the attenuating device can be an absorbing glass plate, such that the projected beam has an intensity distribution similar to that shown in FIG. 8.

In one example, the absorbent devices could be simple glass plates with a clear central section and two edge sections with surface treatments, such that the intensity of a beam being transmitted through the plate is progressively reduced towards two opposed edges of the plates.

An alternative would be a glass plate with partially reflective edges.

For any of the above examples, the absorbing device could be positioned between source 4 and beam splitter 3 as represented by component 30, between beam splitter 3 and controllable contrast devices 2 as represented by device 31, on one surface of beam splitter 3 as represented by device 32, or at any other appropriate position in the optical column, as represented by device 33 which is located between field lens 8 and microlens array 9. In all cases, the device 30, 31, 32 or 33 serves the purpose of reducing the relative intensity of portions of the beam along the edges of the beam that extend parallel to the scan direction.

Exemplary Operation of an Element in the Array of Controllable Elements

FIGS. 11 and 12 schematically represent the manner in which a reflective controllable element is used to adjust the intensity of one part of a beam, according to embodiments of the present invention. In one example, an array of mirrors can be used to deliver maximum intensity (e.g., "white"), minimum intensity (e.g., "black"), and intermediate intensity (e.g., "grey"). Maximum intensity is delivered by contrast device 1 to one lens 34 of microlens array 9 by positioning an individual mirror 2 (representing array 2) so as to extend parallel to the plane of contrast device 1. With such a disposition of the mirror 2, the intensity distribution of the light reflected by that mirror 2, which is represented by curve 35, is centered on an aperture in an aperture place 36. The beam passing through aperture has a central axis indicated by line 37 and is focused by a lens represented by line 38 so as to form a small beam of light, which is in turn focused by lens 34 on substrate 10. The beam delivered by lens 34 is symmetrical about an axis indicated by line 39. Given that the intensity distribution represented by line 35 is symmetrical with the centre of the aperture in the aperture plate 36, a large (e.g., "white") proportion of the light reflected by the mirror 2 reaches substrate 10, and this corresponds to maximum intensity.

If mirror 2 was turned such that substantially none of the reflected light reached the aperture in aperture plate 36, substantially no (e.g., "black") light would reach lens 34, and this would result in a minimum intensity exposure of substrate 10. If however mirror 2 is rotated through a relatively small angle, the reflected beam would be displaced relative to the aperture of aperture plate 36, but some of the reflected light would pass through the aperture.

These circumstances are illustrated in FIG. 12, where it will be seen that intensity distribution 35 is offset relative to the center of the aperture, but does in part overlap that aperture. Thus, some light does reach lens 34, but the intensity of the light delivered to substrate 10 is reduced as compared with the case illustrated in FIG. 11.

In accordance with embodiments of the present invention, light delivered to rows of lenses in microlens array 9 having lenses located adjacent the edges of microlens array 9. The lenses extending parallel to the scanning direction received grey intensity beams from contrast device 1, such that intensity relationships between overlapping optical columns can be achieved.

FIGS. 11 and 12 describe a projection system with a single mirror 2 per pixel on substrate 10. With such an arrangement, the resolution will vary as a function of the grey value in contrast device 1, which is the tilt of mirror 2.

In an alternative arrangement, a diffractive grating formed by, for example, a cluster of several mirrors 2. With such an arrangement, resolution would not depend on the grey value.

FIG. 13 schematically represents an arrangement (e.g., optical footprint) of three optical columns, each incorporating a microlens array positioned to expose overlapping tracks on a substrate, according to one embodiment of the present invention. The optical footprints of three optical columns rely upon grey level illumination of portions of the optical footprints of those columns which overlap. In FIG. 13, the scan direction is represented by arrow 40. A first optical column has an optical footprint represented by rectangle 41. That optical footprint extends as to an edge of an area of a substrate which is to be exposed, that edge being indicated by line 42. Optical footprint 41 also overlaps a region defined between lines 43 and 44, that region also being overlapped by the right hand side of an optical footprint represented by rectangle 45 of an adjacent optical column. Optical footprint 45 overlaps a region bounded by lines 46 and 47, which is also overlapped by the right hand side of an optical column represented by rectangle 48.

The left hand side of the microlens array represented by rectangle 41 is made up of a series of rows of lenses which receive light from mirrors 2 (see, e.g., FIGS. 11 and 12) that are positioned so as to deliver a "grey" level intensity. The right hand side of optical footprint 41 receives full intensity radiation as there is no overlap with an adjacent optical column. In all cases where there is such overlap, however, a reduced intensity beam of radiation is delivered to overlapping portions of the optical footprints.

FIG. 14 schematically represents edge portions of two microlens arrays that form part of adjacent optical columns and which, in part, overlap in the manner illustrated in FIG. 13. In other words, FIG. 14 schematically represents the disposition of individual lenses in two microlens arrays arranged to expose overlapping tracks on a substrate. In FIG. 13 the overlapping portions receive radiation of reduced intensity by appropriate control of a mirror array. However, in the case illustrated in FIG. 14, lenses that contribute to overlapping portions of the optical footprints are treated so as to absorb or otherwise alternate a proportion of the incident radiation. Thus, the substantially constant level of illumination across regions of overlap between adjacent optical footprints, e.g., as represented in FIG. 8, can be maintained.

In one example, one corner of a first microlens array 49 is shown which incorporates rows and columns of lenses represented by circles 50. Each of those lenses expose a spot on an underlying substrate. The position of that spot is indicated by a small circle 51. Microlens array 49 is stationary, but moves relative to an underlying substrate in the direction of arrow 52. This can be based on displacement of the substrate beneath microlens array 49. Thus, microlens array 49 could be represented as one corner of the microlens array 45 illustrated in FIG. 13.

In one example, a corner of a microlens array 53 of an adjacent optical column. Microlens array 53 could correspond to the left hand upper corner of the optical footprint 41 as represented in FIG. 13. Once again, individual lenses are represented by circles 50 and individual illumination spots by circles 51.

Lens 54 in the top row and right most column of the microlens array 49 illuminates a track represented as a space 55 between two lines extending parallel to the scan direction 52. The adjacent lens in the next row illuminates space 57, and adjacent lens 58 in the next row illuminates track 59. These tracks will overlap slightly so that if all three lenses 54, 56, and 58 receive a beam of radiation of the same intensity substantially uniform exposure of the area overlapped by the tracks 55, 57 and 59 will result.

Lenses 54, 56 and 58 are aligned in the scan direction with lenses 60, 61 and 62 of the microlens array 53. Thus, each of these lenses 60, 61 and 62 is capable of illuminating a respective one of tracks 55, 57 and 59. For example, if there is perfect alignment and each of the six lenses 54, 56, 58, 60, 61 and 62 shown in the two microlens arrays of FIG. 14 delivers a 50% beam of radiation, as compared with all other lenses in the arrays that deliver a 100% beam of radiation, then there will be a uniform 100% exposure of all of the tracks exposed by the two microlens arrays.

In one example, each microlens array has 64 rows of lenses making it possible to expose 64 overlapping tracks. Each lens in the row is provided with a surface treatment, such that a proportion of any received radiation is absorbed. For example, lens 60 could be manufactured to absorb $1/64$ of an incoming beam, lens 61 to absorb $2/64$, lens 62 to absorb $3/64$, and so on with lens 54 being arranged to absorb $63/64$, lens 56 to absorb $62/64$, lens 58 to absorb $61/64$, and so on. Thus, in this example, each track would, if the tracks traversed by the two microlens arrays are almost perfectly aligned, deliver exactly $64/64$ of an incoming beam. If the microlens arrays are misaligned by the width of one track, for example, as a result of the area of overlap being reduced by one track, the maximum intensity variation across the boundary between any two optical columns would be a reduction of $1/64$ of the desired intensity across the area of overlap.

In one example of the embodiment shown in FIG. 14, an assumption can be made that only one column of lenses in each microlens array is treated to absorb a proportion of an incoming beam. It is also assumed that the angle of inclination of the columns to scan direction 52 and the pitch of lenses 50 is such that each column allows exposure of 64 tracks, the width of each of which is $1/64$ of the pitch of the lenses.

It is to be appreciated that this example is given only for the purposes of explanation, and alternatively a substantial number of columns of lenses adjacent the periphery of the optical column is treated with, for example, a layer of radiation absorbing material to deliver the appropriate radiation intensity at the underlying substrate.

In one example of an arrangement, for example as that illustrated in FIGS. 11 and 12, each mirror is, for example, of the order of 16 micrometers square, with each mirror illuminating a respective one of an array of lenses in a microlens array. Each lens could deliver a spot of diameter 1.25 micrometers at the substrate. Each microlens array could have a row (e.g., transverse to the scan direction) of, for example, 500 lenses with the depth of the microlens array (e.g., in the direction of scan) accommodating for example 200 rows of lenses. In this example, each column of 200 lenses can expose a track 250 micrometers wide 9 (200×1.25 micrometers).

In the description of one or more of the various embodiments and/or examples above, it is assumed that each "beam" is produced by a respective optical column including an array of lenses with all of the lenses of that array directing parts of a single beam towards the substrate. One or more of the above embodiments and/or examples apply to overlapping portions of the optical footprints of two adjacent optical columns. However, other examples allow a reduction in imaging errors that can occur between adjacent columns of lenses within an array of lenses of a single optical column. In this example, each "beam" is produced using a respective column of lenses in a single array of lenses within one optical column. This additional application of the invention is further described with reference to FIGS. 15 and 16.

FIG. 15 is an illustration of overlapping tracks produced by different optical columns, according to one embodiment of the present invention. This embodiment is most similar to the embodiments shown in FIGS. 13 and 14, but incorporates two optical columns each including an array of lenses 63, 64 made up from four columns of lenses c1, c2, c3 and c4 with each column including ten lenses arranged to define ten rows of lenses r1 to r10. The scan direction is represented by arrow 65, such that the columns of lenses of array 63 contribute to an area defined between lines 66, and the columns of lenses of array 64 contribute to an area defined between lines 67. There is therefore an area of overlap between the lenses in the first four rows of the right hand column (column c4 rows r1 to r4) of array 63 and the lenses in the last four rows of the left hand column of array 64 (column c1 rows r7 to r10). The maximum intensity of illumination of the two arrays of lenses is represented by lines 68 and 69. Thus, uniform maximum intensity is achieved across the "seam" between the optical footprints of the two optical columns.

FIG. 16 is a representation of overlapping tracks produced by adjacent columns of lenses in an array of lenses, according to one embodiment of the present invention. This illustrates an embodiment in which overlapping "seams" are provided between different columns of lenses in a single lens array, rather than between adjacent lens arrays as in the embodiment shown in FIG. 15. A single lens array 70 is represented in FIG. 16, that array having four columns of lenses c1 to c4 arranged in thirteen rows r1 to r13.

In the embodiment shown in FIG. 16, the scan direction is represented by arrows 71. Thus, it will be seen that there is overlap between adjacent columns, for example in the zones located between lines 72 and 73. Within each overlapping column, the maximum intensity is indicated by line 74. Thus rows r1 to r3 of columns c1, c2 and c3 and rows r10 to r13 of columns c2, c3 and c4 are of reduced maximum intensity. As a result, the maximum intensity across the full width of the track on the substrate scanned by the illustrated optical column is substantially constant. By considering the patterned beams delivered to adjacent columns of lenses as different "beams," it will be seen that the tracks along which adjacent beams are scanned overlap and the maximum intensities of the overlapping and non-overlapping parts of the beams are such that all the target surface of the substrate is exposed to radiation of substantially the same maximum intensity.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
 optical columns comprising patterning systems and projection systems, wherein,
  each of the patterning systems are configured to emit a corresponding patterned beam,
  each of the projection systems are configured to project the patterned beams onto corresponding target portions of a substrate, the projection systems comprising an array of lenses, such that each lens in the array directs a respective part of a respective one of the patterned beams towards the substrate; and
 a displacement system configured to cause relative displacement between the substrate and the projection systems, such that the patterned beams are scanned across the substrate in a predetermined scanning direction, wherein the projection systems are positioned to allow each patterned—beam to be scanned along a respective one of a series of overlapping tracks on the substrate, wherein each of the tracks comprises,
  a first portion that is scanned by only one of the patterned beams, and
  at least one second portion that overlaps an adjacent track to the track and is scanned by two of the patterned beams; and
 wherein an intensity of each of the patterned beams is determined based on a misalignment between the patterned beams or a misalignment between the tracks.

2. The apparatus of claim 1, wherein a maximum intensity of a first part of each respective one of the patterned beams directed towards the first portion of a respective one of the tracks is greater than a maximum intensity of a second part of that beam directed towards the second portion of that track, such that the first and second portions of that track are exposed to radiation of substantially the same maximum intensity.

3. The apparatus of claim 1, wherein:
 the optical columns are distributed across the substrate in a direction perpendicular to the scanning direction; and
 adjacent ones of the optical columns are offset in the scanning direction.

4. The apparatus of claim 1, wherein:
 at least two overlapping ones of the patterned beams are directed towards the substrate by respective columns of lenses of a common array of lenses;
 the columns are adjacent to the common array;
 the columns extend in a direction inclined with respect to the scanning direction; and
 the columns are spaced apart in a direction perpendicular to the scanning direction.

5. The apparatus of claim 1, wherein each projection system comprises:
 an attenuating device through which a respective one of the patterned beams is transmitted;
 wherein at least one peripheral portion of the attenuating device attenuates a proportion of the respective patterned beam; and
 wherein the attenuating device is positioned so that the respective patterned beam transmitted through the peripheral portion is projected towards a respective one of the second portions of a respective one of the tracks.

6. The apparatus of claim 5, further comprising an illumination system, wherein the attenuating device is positioned between the illumination system and an optical column, wherein the illumination system is configured to provide illumination that is received by the optical column.

7. The apparatus of claim 5, wherein the attenuating device is positioned between an optical column and the substrate.

8. The apparatus of claim 1, wherein:
 each of the patterning systems comprises an array of individually controllable emissive elements, such that individual controllable emissive elements are controlled to direct at least one of a maximum, a minimum, or at least one intermediate intensity component of a respective one of the patterned beams towards the substrate.

9. The apparatus of claim 8, wherein each of the optical columns further comprises:
 a control device that controls each of the elements in a respective one of the arrays of individually controllable emissive elements to reduce the intensity of components of the patterned beam directed towards a respective one of the second portions of a respective one of the tracks as compared with components of the patterned beam directed towards a respective one of the first portions of a respective one of the tracks by directing components of the intermediate intensity towards the respective second portion of the respective track and components of the maximum intensity towards the respective first portion of the respective track.

10. The apparatus of claim 1, wherein lenses of the array that direct parts of a patterned beam towards a respective one of the second portions of a respective one of the tracks are arranged to attenuate more of the patterned beam than lenses of the array that direct parts of the patterned beam towards a respective one of the first portion of the respective track.

11. The apparatus of claim 1, wherein the intensity of a second part of a respective one of the patterned beams is reduced progressively from an edge of a respective one of the second portions of a respective one of the tracks that is adjacent to the first part of that track to the other edge of the second portion of that track.

12. A device manufacturing method, comprising:
transmitting patterned beams of radiation with respective optical columns, wherein each optical column comprises an array of individually controllable emissive elements,
projecting the patterned beams onto target portions of a substrate;
causing relative displacement between the substrate and the patterned beams, such that the patterned beams are scanned across the substrate in a predetermined scanning direction;
directing each respective one of the patterned beams towards the substrate through an array of lenses, each lens in the array directing a respective part of the patterned beams;
scanning each respective patterned beam a respective one of a series of tracks on the substrate, wherein each of the tracks comprises a first portion that is scanned by only one of the patterned beams and at least one second portion that overlaps an adjacent one of the tracks and is scanned by two of the patterned beams; and
determining an intensity of each of the patterned beams based on a misalignment between the patterned beams or a misalignment between the tracks.

13. The method of claim 12, further comprising:
directing a maximum intensity of a first part of each of the patterned beams towards a first portion of one of the tracks, which is greater than a maximum intensity of a second part of that beam directed towards a second portion of the track, such that the first and second portions of the track are exposed to radiation of substantially the same maximum intensity.

14. The method of claim 12, further comprising:
distributing the respective optical columns across the substrate in a direction perpendicular to the scanning direction, such that adjacent ones of the optical columns are offset in the scanning direction.

15. The method of claim 12, wherein at least two overlapping ones of the patterned beams are directed towards the substrate by respective ones of columns of lenses of a common array of lenses, the columns being adjacent in the common array, extending in a direction inclined to the scanning direction, and being spaced apart in a direction perpendicular to the scanning direction.

16. The method of claim 12, further comprising:
transmitting each of the patterned beams through an attenuating device, wherein at least one peripheral portion of each of the patterned beams is reduced in intensity by relatively highly attenuating peripheral portions of the attenuating device.

17. The method of claim 16, further comprising positioning the attenuating device between an illumination system and an optical column, wherein the illumination system is configured to provide illumination that is received by the optical column.

18. The method of claim 16, further comprising positioning the attenuating device between an optical column and the substrate.

19. The method of claim 12, wherein the patterning step comprises:
controlling individual emissive elements of one of the array of individually controllable emissive elements to direct components of a respective one of the patterned beams towards either one of the first portions of one of the tracks or one of the second portions of the track; and
controlling the individual emissive elements so that components of at most an intermediate intensity are directed towards the one of the second portions of the track and components of maximum intensity are directed towards the one of the first portions of the track.

20. The method of claim 12, wherein the directing step comprises:
attenuating more of a patterned beam with the lenses of the array that direct parts of the patterned beam towards one of the second portions of one of the tracks than lenses of the array that direct parts of the patterned beam towards one of the first portions of the track.

21. The method of claim 12, further comprising:
progressively reducing an intensity of a second part of a respective one of the patterned beams from an edge of a respective one of the second portions of a respective one of the tracks that is adjacent to a respective one of the first portions of that track to the other edge of a respective one of the second portions of the track.

* * * * *